United States Patent
Thomas

(10) Patent No.: US 6,860,418 B2
(45) Date of Patent: Mar. 1, 2005

(54) METHOD FOR MAKING A BONDING TOOL

(75) Inventor: Mary Patricia Thomas, Orlando, FL (US)

(73) Assignee: Lockheed Martin Corporation, Bethesda, MD (US)

( * ) Notice: Subject to any disclaimer, the term of this patent is extended or adjusted under 35 U.S.C. 154(b) by 119 days.

(21) Appl. No.: 10/198,117

(22) Filed: Jul. 19, 2002

(65) Prior Publication Data

US 2004/0011853 A1 Jan. 22, 2004

(51) Int. Cl.[7] .............................................. B23K 3/00
(52) U.S. Cl. ................................................... 228/49.5
(58) Field of Search ........................... 228/178–180.22, 228/214, 234.1, 235.1, 49.3, 49.5, 49.1, 47.1; 156/580, 581; 29/829; 428/600, 596, 620

(56) References Cited

U.S. PATENT DOCUMENTS

| | | | | |
|---|---|---|---|---|
| 2,405,778 A | * | 8/1946 | Crawford ...................... | 72/472 |
| 3,172,343 A | * | 3/1965 | Jacobs ......................... | 428/600 |
| 3,247,578 A | * | 4/1966 | Jaremus et al. .............. | 136/201 |
| 3,310,388 A | * | 3/1967 | Bennett et al. .............. | 428/594 |
| 3,399,332 A | * | 8/1968 | Savolainen .................. | 257/746 |
| 3,475,814 A | * | 11/1969 | Santangini ............. | 228/180.21 |
| 3,666,588 A | | 5/1972 | Wanesky | |
| 3,698,618 A | | 10/1972 | Heida | |
| 4,995,551 A | | 2/1991 | MacKay | |
| 5,381,304 A | | 1/1995 | Theroux et al. | |
| 5,868,301 A | * | 2/1999 | Distefano et al. ...... | 228/180.21 |
| 6,051,481 A | | 4/2000 | Kuiken et al. | |
| 2001/0020636 A1 | * | 9/2001 | Koskenmaki et al. .. | 228/180.22 |

* cited by examiner

Primary Examiner—Kiley Stoner
Assistant Examiner—Kevin L McHenry
(74) Attorney, Agent, or Firm—Burns, Doane, Swecker & Mathis, L.L.P.

(57) ABSTRACT

A method for making a bonding tool is provided. The bonding tool includes a three dimensional surface configuration which is a mirror image of a three dimensional surface configuration of a circuit card assembly (CCA). The method includes creating a mirror image of the three dimensional surface configuration of the CCA. After producing the three dimensional surface configuration of the CCA, the method then produces a bonding tool surface with the mirror image of the three dimensional surface configuration. The mirror image of the three dimensional surface configuration isolates delicate components of the CCA during bonding and re-bonding operations of the CCA using the bonding tool.

8 Claims, 4 Drawing Sheets

METHOD FOR MAKING A BONDING TOOL

BACKGROUND OF THE INVENTION

1. Field of the Invention

The present invention relates generally to bonding tools for bonding boards of circuit card assemblies and more specifically to a method for manufacturing a bonding tool.

2. Description of Related Art

Many electronics used today include electronic control assemblies (ECAs) formed using circuit card assemblies (CCAs) having printed circuit boards (PCBs). The CCAs used for the ECAs include various components necessary for the functionality of the CCA and an electronic device using the CCA. These components include resistors, capacitors, inductors, RF components, output pins, and the like having delicate leads which facilitate connectivity and functionality of the components.

During formation of the ECA, the CCA is bonded with a substrate, such as a heat sink, in order to provide a backbone to the structure and provide heat dissipating capabilities for the CCA. During production of ECAs, manufacturing defects may occur which may render the ECA non-functional for the intended use of the ECA. These defects include contamination and scratching of the substrate and/or CCA during bonding, and bubble formation within the CCA.

To correct the defects caused during production, a user removes the CCA from the substrate and repairs the defect. Typically, the user removes the CCA from the substrate using well known processes, such as use of a wire in a guillotine manner which allows for removal of the CCA from the substrate. Upon removal of the CCA, the manufacturing defects are repaired and the CCA re-bonded to the substrate. In order to properly re-bond the CCA with the substrate, the CCA along with the substrate and bonding material are subjected to high pressure in order to facilitate re-bonding. However, the high pressure and the vacuum environment often times damages the components of the CCA, thereby necessitating replacement of the components. More specifically, the high pressure damages the delicate leads on the components, thereby rendering the component non-functional. The components with damaged leads can not be repaired, thereby additional components are required increasing overall costs. Likewise, costs associated with re-bonding are further increased due to the labor required to reinstall the components with standard manual soldering methods.

To avoid the aforementioned problems and crushing components of the CCA during re-bonding of the CCA, the components were removed. Nonetheless, if the CCAs requiring re-bonding employed the previously described leads and other delicate components, the delicate components were not easily removable. To further illustrate, the leads typically have very little structural rigidity and used the CCA for structural support. As such, upon removal of the components from the CCA, the leads would curl into itself thereby negating re-soldering to the CCA. As a result, the CCA required replacement components in order to successfully re-bond the CCA to the substrate.

BRIEF SUMMARY OF THE INVENTION

The present invention is directed towards providing a bonding tool for bonding a circuit card assembly (CCA) and a method for making the bonding tool. A configuration of the bonding tool complements a configuration of the CCA such that the bonding tool isolates delicate components of the CCA from pressure during a bonding or re-bonding operation.

In one exemplary embodiment of the present invention, a method for producing a bonding tool for bonding a board of a CCA is disclosed. The CCA can include a three dimensional surface configuration defined by various components of the surface of the CCA, such as resistors, inductors and the like. An exemplary method comprises creating a mirror image of the three dimensional surface configuration of the board. After creation of the mirror image, a bonding tool surface with the mirror image of the three dimensional surface configuration is created. The mirror image of the bonding tool surface complements the surface of the CCA, such that during bonding and re-bonding operations, the bonding tool isolates components of the CCA from pressure.

In another exemplary embodiment of the present invention, a bonding tool is disclosed. In this embodiment, the bonding tool bonds a CCA having a three dimensional surface configuration to a substrate during manufacturing of the CCA. In addition, the bonding tool can be used to re-bond a CCA during repair of a CCA. The bonding tool is a metal structure having a bonding tool surface. The bonding tool surface includes a three dimensional surface configuration which complements the CCA. As such, during bonding or re-bonding of the CCA to a substrate or heat sink with the bonding tool, the bonding tool minimizes the possibility of damaging components on the CCA.

As may be appreciated, exemplary embodiments provide a bonding tool which can minimize the possibility of damaging components located on a CCA during bonding and re-bonding operations. The configuration of the bonding tool can also minimize the time associated with re-bonding a CCA since a user does not remove components during the re-bonding operation, thereby saving the costs associated with having a user individually remove components from the CCA. The configuration of the bonding tool can also minimize material cost replacement components which have been damaged or do not have structural integrity to withstand removal and replacement.

BRIEF DESCRIPTION OF THE DRAWINGS

Many advantages of the present invention will be apparent to those skilled in the art with a reading of this specification in conjunction with the attached drawings, wherein like reference numerals are applied to like elements and wherein.

DETAILED DESCRIPTION OF THE INVENTION

Figure 1:
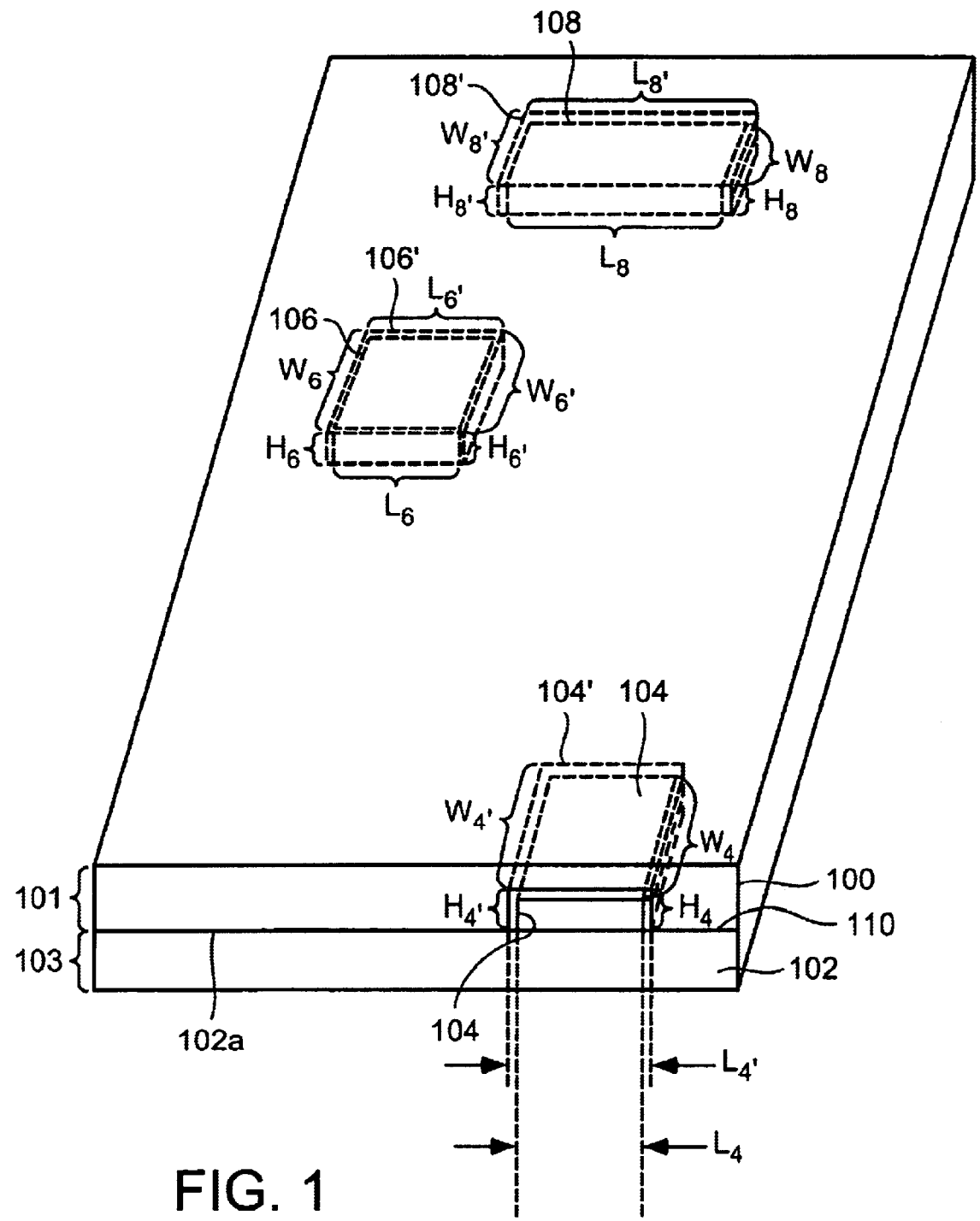
FIG. 1 illustrates a circuit card assembly (CCA) having a board with components in accordance with an embodiment of the present invention.

The present invention relates to a bonding tool and a method for forming a bonding tool. FIG. 1 is a perspective view illustrating a bonding tool 101 having a metal structure 100 in accordance with an embodiment of the present invention. The bonding tool 101 includes a bonding tool surface 110 having a three dimensional surface configuration which mirrors a three dimensional surface configuration 102a of a circuit card assembly (CCA) 103. The bonding tool 101 includes recesses 104' through 108' which mirror components on a board 102 of the CCA 103. The configuration of the recesses 104' through 108' allows fitment of components 104 through 108 of the CCA 103 within the recesses 104' through 108' during use of the bonding tool 101.

The recesses 104' through 108' include dimensions which are a mirror image of the dimensions of the components 104 through 108 thereby providing the bonding tool 101 with a mirror image of the three dimensional surface configuration of the CCA 103. The recess 104' includes dimensions $H_{4'}$, $W_{4'}$, and $L_{4'}$, the recess 106' includes dimensions $H_{6'}$, $W_{6'}$, and $L_{6'}$, and the recess 108' includes dimensions $H_{8'}$, $W_{8'}$, and $L_{8'}$. The dimensions of the recess 104' correspond to the dimensions of the component 104. The dimension $H_{4'}$, corresponds to dimension $H_4$ of the component 104 while dimension $W_{4'}$, corresponds to the dimension $W_4$ of the component 104 and dimension $L_{4'}$, corresponds to dimension $L_4$ of the component 104. Therefore, the recess 104' forms a mirror image of the component 104. However, the dimensions $H_{4'}$, $L_{4'}$, and $W_{4'}$, of the recess 104' are slightly larger than the dimensions $H_4$, $L_4$ and $W_4$ of the component 104. The slightly larger dimensions of the recess 104' allow placement of the component 104 within the recess 104' during bonding operations using the bonding tool 101 such that the bonding tool 101 does not contact the component 104.

Likewise, the dimensions of the recess 106' correspond to dimensions of the component 106. The dimension $H_{6'}$ corresponds to dimension $H_6$ of the component 106 and the dimension $W_{6'}$, corresponds to dimension $W_6$ of the component 106 while the dimension $L_{6'}$, corresponds to dimension $L_6$ of the component 106. In addition, the dimensions $H_{8'}$, $W_{8'}$, and $L_{8'}$, of the recess 108' correspond to dimensions $H_8$, $W_8$ and $L_8$ of the component 108. The dimensions correspond such that the components 106 and 108 fit within the recesses 106' and 108' during application of the bonding tool 101 upon the CCA 103. As discussed with reference to the recess 104' and the component 104, the dimensions $H_{6'}$, $L_{6'}$, $W_{6'}$, $H_{8'}$, $L_{8'}$, and $W_{8'}$, of the recesses 106' and 108' are slightly larger than the dimensions $H_6$, $L_6$, $W_6$, $H_8$, $L_8$ and $W_8$ of the components 106 and 108. Therefore, upon placement of the bonding tool 101 onto the CCA 103, the components 106 and 108 fit within the recesses 106' and 108'. It should be noted that while the CCA 103 and the bonding tool 101 have been described to include the components 104 through 108 and the recesses 104' through 108', the CCA 103 may include any number of components having any type of configuration (e.g., a mix of resistors, capacitors, inductors, power supplies, etc.) to form a three dimensional surface configuration. In accordance with an embodiment of the present invention, the bonding tool 101 will be a mirror image of the CCA 103 irrespective of the amount and the configuration of the components on the CCA 103. Thus, the bonding tool 101 will have any number of recesses corresponding to the three dimensional surface configuration of the CCA 103. In addition to the recesses 104' through 108', the bonding tool 101 also includes a protrusion 210 as shown with reference to FIG. 2.

Figure 2:
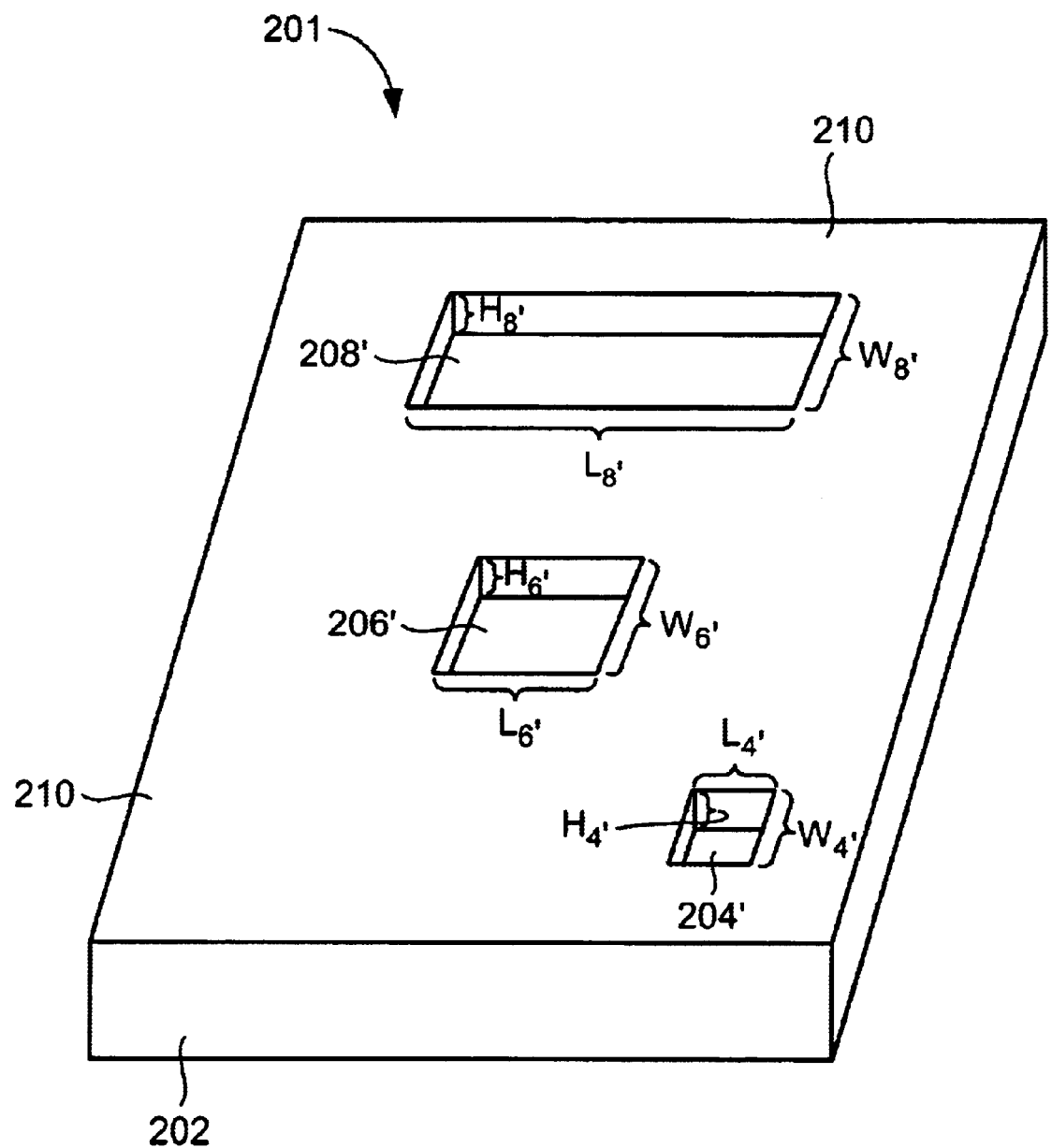
FIG. 2 illustrates a perspective view of a bonding tool in accordance with an exemplary embodiment of the present invention.

FIG. 2 illustrates a perspective view of a bonding tool 201 in accordance with an embodiment of the present invention. The protrusion 210 corresponds to a surface 302a of a CCA 303 (shown with respect to FIG. 3). As such, upon application of the bonding tool 201 to the CCA 303, the protrusion 210 is adjacent the surface 302a. Therefore, during a bonding operation using the bonding tool 201 and the CCA 303, the high pressures imparted by the bonding tool 201 transmit to the CCA 303 via the protrusions 210 and the surface 302a. Thus, recesses 204' through 208' of the bonding tool 201 isolate components 304 through 308 of the CCA 303 from high pressures imparted by the bonding tool 201. The bonding tool 201 bonds the CCA 303 to a substrate such as a heat sink 300. In an embodiment of the present invention, the bonding tool 201 can be constructed of any material 202 capable of withstanding high vacuum and pressure, such as metal or the like. It should be understood that the surface 302a of the CCA 303 is not limited to the configuration shown with respect to FIG. 3. Consequently, the protrusions 210 shown and described with reference to FIG. 2 are not limited to that particular configuration. As previously mentioned, the CCA 303 may have numerous configurations. Thus, the bonding tool 201 will have protrusions 210 which correspond to the numerous configurations of the surface 302a of the CCA 303.

The bonding tool 201 can be used for a variety of bonding operations, including bonding a substrate to a heat sink or the like. During the bonding operation, the recesses 204' through 208' allow bonding to the substrate under both pressure and vacuum while minimizing the possibility of damaging the components 304 through 308 of the CCA 303. Moreover, the protrusions 210 provide a contact surface between the bonding tool 201 and the CCA 303 such that the bonding tool may impart bonding forces to the CCA 303 during a bonding operation. It should be noted that the bonding tool 201 includes a plurality of protrusions (not shown) which contact a plurality of surfaces (not shown) of the CCA 303. Accordingly, the bonding tool 201 translates forces during bonding operations to the CCA 303 via the plurality of protrusions on the bonding tool 201 and the plurality of surfaces on the CCA 303. As may be appreciated, the bonding tool 201 protects the components located on the CCA 302, such as the component 304, via recesses, such as the recess 304', during bonding operations.

Figure 3:
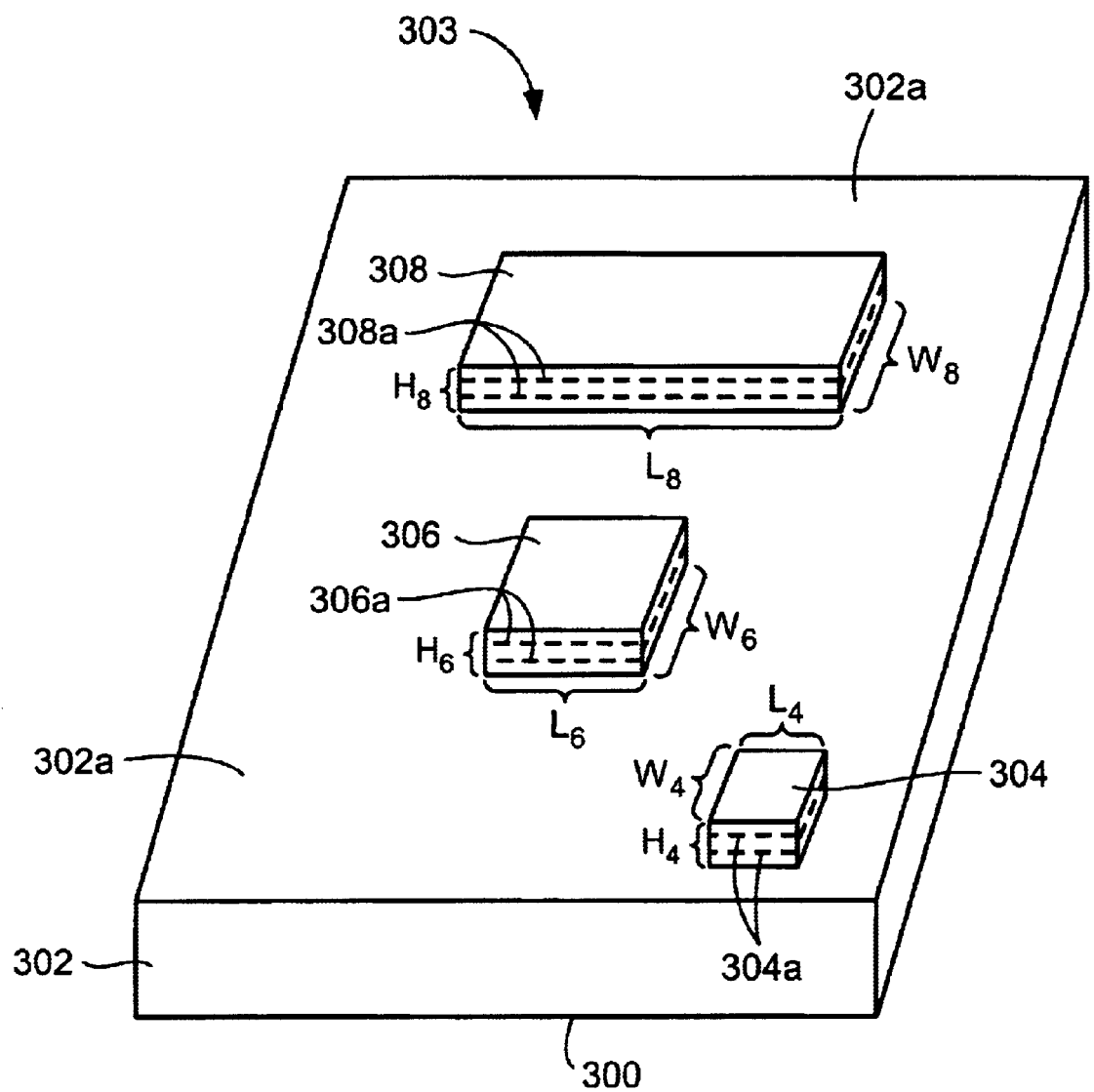
FIG. 3 illustrates a schematic view of an exemplary embodiment of the present invention demonstrating the placement of a bonding tool onto a CCA.

FIG. 3 illustrates the CCA 303 having a board 302 and components 304 through 308. In accordance with an embodiment of the present invention, the components 304 through 308 can be any components which provide functionality for the CCA 303. These components include but are not limited to, electrical and/or mechanical inductors, resistors, capacitors, power sources, and other components. In addition, the components 304 through 308 can include leads 304a through 308a which provide connectivity and functionality for the components 304 through 308. The components 304 through 308 protrude from a surface 302a of the board 302 thereby forming a three dimensional surface configuration for the CCA 303. It should be noted that the previously described recesses isolate the leads 304a through 308a during application of a bonding tool made in accordance with the present invention to the CCA 303.

The components 304 through 308 include the dimensions $H_4$ through $H_8$, $W_4$ through $W_8$ and $L_4$ through $L_8$. The dimensions $H_4$ through $H_8$ correspond to a protrusion height of the components 304 through 308 from the surface 302a of the board 302. The dimensions $W_4$ through $W_8$ correspond to a width of the components 304 through 308. It is to be understood that the dimensions $H_4$ through $H_8$, $W_4$ through $W_8$ and $L_4$ through $L_8$ can be formed to any dimension. The dimensions $L_4$ through $L_8$ correspond to a length of the components 304 through 308. The CCA 303 can include any number of components having a variety of dimensions. A user can generate a schematic and topographical layout of the CCA 303 using an electronic tool capable of generating an electronic layout, such as Pro/ENGINEER® (CAD/CAM) software available from Parametric Technology Corporation located in Needham, Mass. or CATIA-CADAM® software available from Dassault Systems located in Woodland Hills, CA or the like. As a user generates the CCA 303, the various dimensions for the CCA 303 can be stored within a database created by the electronic tool. Using the electronic tool, a user forms a mirror image of the CCA 303 using the various dimensions stored in the database created by the electronic tool.

Figure 4:
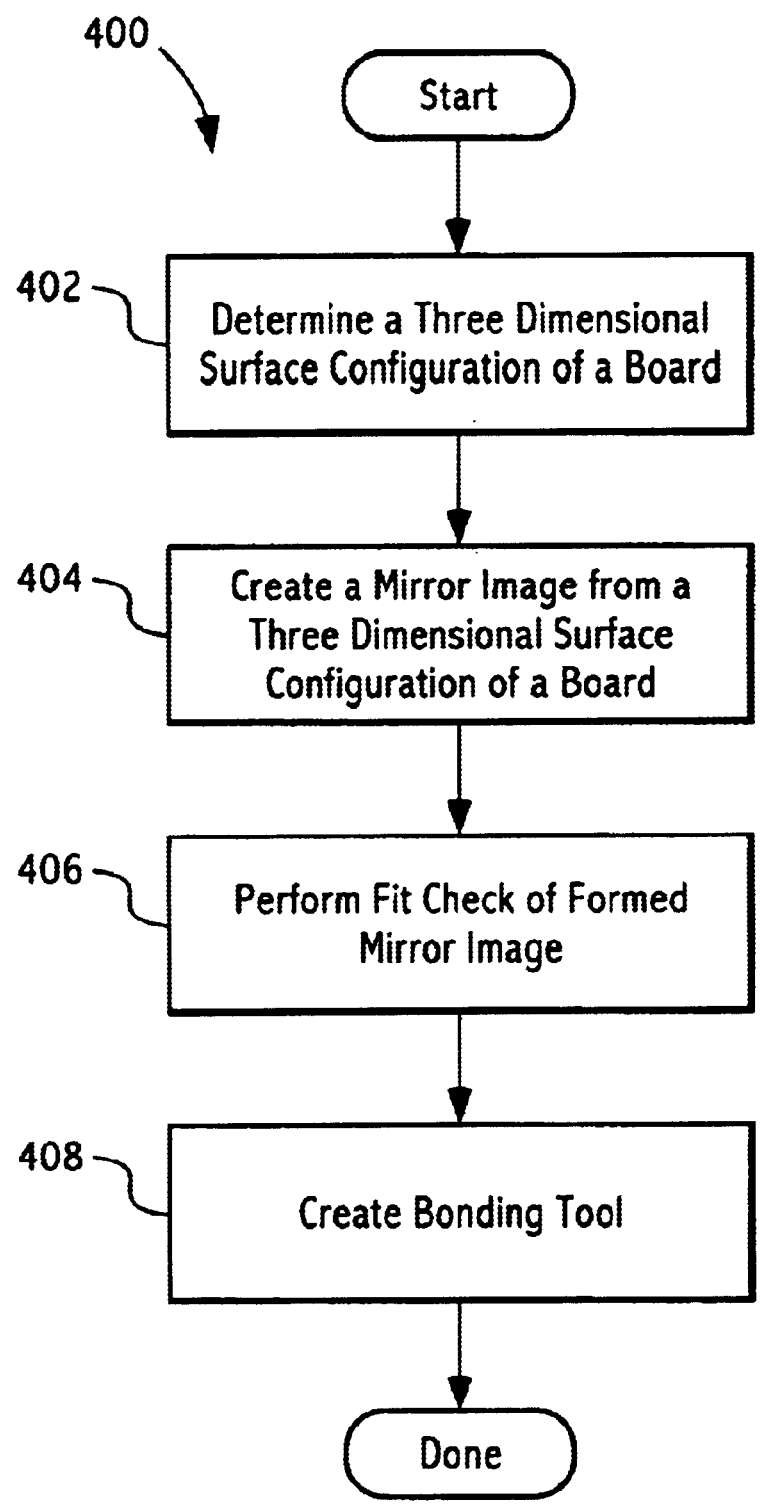
FIG. 4 is a flowchart showing an exemplary method for forming a bonding tool in accordance with an embodiment of the present invention.

FIG. 4 illustrates a method 400 for making a bonding tool. In an exemplary operation 402, a user determines a three dimensional surface configuration of a CCA board. The three dimensional surface configuration includes various components on a surface of the CCA board, such as resistors, capacitors, inductors, power supplies or the like. During this operation, the user determines what areas of the CCA may be subjected to pressure (e.g., bare areas of the CCA) and the location of components that are not capable of resisting bonding pressure forces. In an embodiment of the present invention, a user makes this determination using an electronic layout of the board with the previous described software. The electronic layout of the board includes various dimensions of the components, including, height, width and length of the components.

For example, Pro/ENGINEER® can be used to generate an electronic layout of the CCA 303 used to fabricate the CCA 303 shown with respect to FIG. 3. The electronic layout includes the various dimensions of the components 304 through 308 and the surface 302a. In the operation 402, a user accesses a Pro/ENGINEER® database having data corresponding to the various dimensions of the components 304 through 308 and the surface 302a of the CCA 303. Using the Pro/ENGINEER® database, the user determines the three dimensional surface configuration of the CCA 303.

Once the user determines the three dimensional surface configuration of the CCA 303, an operation 404 is performed. In the operation 404, a user creates a mirror image of the three dimensional surface configuration using the three dimensional surface configuration of the CCA board determined in the operation 402.

Turning back to the example, a user creates a mirror image of the CCA 303 using the Pro/ENGINEER® database having the dimensions of the various components of the CCA 303. The user reads data from the Pro/ENGINEER® database and creates a mirror image of the data in a separate file. If the dimensions $L_4$, $W_4$ and $H_4$ of the component 304 have values of 0.25 inches, 0.25 inches and 0.125 inches, the user creates a recess having dimensions slightly larger than $L_4$, $W_4$ and $H_4$ (e.g., 0.26 inches, 0.26 inches and 0.135 inches) in a separate Pro/ENGINEER® database. As such, when the user places a bonding tool formed with these dimensions over the CCA 303, the bonding tool will not contact the component 304. It should be noted that during the operation 404, the user creates recesses for all components of the CCA 303, such as the components 306 and 308 and any other components. In accordance with an embodiment of the present invention, components are structures which may be damaged during a bonding operation performed on the CCA 303. For surfaces that will not be damaged (e.g., bare areas of the CCA 303), the user does not incorporate recesses into the mirror image of the three dimensional surface configuration of the mirror image.

Once the user creates the mirror image of the three dimensional surface configuration of the CCA 100, the user can produce a bonding tool surface with the adjusted mirror image of a three dimensional surface configuration. In accordance with an embodiment of the present invention, the user can form the mirror image bonding tool using any suitable stereo lithography technique. Typically, a stereo lithography assembly (SLA) grows a mirror image bonding tool. In this embodiment, the user sends an electronic version of the Pro/ENGINEER® database file to an SLA machine which grows the bonding tool mirror image. Upon formation of the mirror image bonding tool, an operation 406 is performed.

In the operation 406, a user performs a fit check of the formed mirror image. Returning to the example, after formation of the mirror image of the three dimensional surface configuration of the board using a SLA machine, the user fit checks the model against the board. In this example, the user performs the fit check at an electrostatic discharge (ESD) workstation. The user places the formed mirror image over the CCA 303 to ensure that the components 304 through 308 do not touch the formed mirror image. Once the user completes the fit check during the operation 406 and determines proper fitment over the CCA 100, an operation 408 is performed.

During the operation 408, the bonding tool is produced using dimensions of the mirror image of the three dimensional surface configuration of the board created in the operation 404. The bonding tool can be formed using any suitable technique or fabrication device capable of forming tools of a material which withstands high vacuum and pressure, such as metal. The tools which may be used to form the bonding tool include a milling machine, a computer numerically controlled (CNC) machine, or the like. A user transfers data for the bonding tool to the fabrication device using any suitable method such as electronic transfer of an electronic file to the fabrication machine. It should be noted that in accordance with alternative embodiments of the present invention, data can be transferred using any suitable technique, including hard data (e.g., printed layouts, etc.), to a user of a machine where the machine is capable of fabricating the bonding tool.

After the various dimensions of the bonding tool are transferred, the CNC machine fabricates the bonding tool according to the dimensions. Upon fabrication of the bonding tool, the bonding tool is deburred and any sharp edges of the tool are broken. Deburring and removal of sharp edges removes slivers and metallic fleck created during production of the bonding tool. As such, deburring and removal of slivers minimizes the possibility of injuring the user during handling of the bonding tool, puncture of the bonding vacuum pressure system, and damaging the CCA (e.g., slivers, flecks, etc. coming into contact with CCA). Once all sharp edges are broken and the tool is deburred, a coating is applied on a side of the bonding tool which contacts the CCA. The coating provides a cushion between the bonding tool and the CCA to protect the CCA from friction which may occur during bonding or re-bonding operations.

Turning back to the example and FIG. 2, the dimensions used to form the readjusted mirror image of the CCA 303 of FIG. 3 are used to produce the bonding tool 201 shown with reference to FIG. 2 in the operation 408. As previously described, the user formed the mirror image of the CCA 303 using Pro/ENGINEER®. As such, the user transfers an electronic file having the Pro/ENGINEER® database to a CNC machine which fabricates the bonding tool 201 shown with respect to FIG. 2. Once the CNC machine completes fabrication of the bonding tool 201 and the bonding tool 201 is deburred, all sharp edges are broken, and coating applied, the bonding tool 200 can be used for bonding operations.

Exemplary embodiments of the present invention can reduce overall time and costs associated with manufacturing CCAs due to necessity of hand installation of delicate components after bonding. Exemplary embodiments of the present invention can reduce time required to repair manufacturing defects. Exemplary embodiments can be used to obviate the need for removal of individual components of a CCA by a user prior to re-bonding since the bonding tool can be fit over individual components. Exemplary embodiments can reduce the possibility of introducing workmanship defects which may be caused during reattachment of the individual components to the CCA.

An exemplary tool of the present invention can apply high pressure in a vacuum environment to a CCA having delicate components. Likewise, a bonding tool made in accordance with an exemplary embodiment of the present invention can reduce the possibility of damaging delicate components of the CCA, thereby obviating the need for removal of components from the CCA during initial bonding or re-bonding of the CCA with a substrate. A bonding tool made in accordance with the present invention can be configured for any number of configurations of CCAs.

The above are exemplary modes of carrying out the invention and are not intended to be limiting. It will be apparent to those of ordinary skill in the art that modifications thereto can be made without departure from the spirit and scope of the invention as set forth in the accompanying claims.

What is claimed:

1. A bonding tool comprising:

a metal structure, the metal structure including:

a bonding tool surface having a three dimensional surface configuration formed with a mirror image of a three dimensional surface configuration of a circuit card assembly (CCA), and recesses which mirror components of a board of the CCA.

2. Tool of claim 1, wherein the recesses are structured such that upon application of the bonding tool with the board, the components fit within the recesses, thereby preventing contact between the components of the board and the bonding tool.

3. Tool of claim 2, the metal structure further comprising:

protrusions which mirror areas of the board not having the components such that during application of the bonding tool upon the board, the protrusions contact the areas of the board without components.

4. Tool of claim 2, wherein a mirror image of both the components of the board and areas of the board not having components is formed using an electronic drafting tool.

5. Tool of claim 4, wherein both the recesses and the protrusions are formed using the mirror image.

6. Tool of claim 2, wherein the bonding tool bonds the board to a substrate such as a heat sink.

7. Tool of claim 6, wherein a configuration of the recesses allows bonding to the substrate under both pressure and vacuum without damaging the components of the board.

8. Tool of claim 7, wherein protrusions of the tool allow contact between bonding tool and the board during bonding of the board with the substrate.

* * * * *